(12) United States Patent　　(10) Patent No.: US 9,786,565 B2
Fukutome et al.　　(45) Date of Patent: Oct. 10, 2017

(54) SEMICONDUCTOR DEVICE AND METHOD OF MANUFACTURING THE SEMICONDUCTOR DEVICE

(75) Inventors: Hidenobu Fukutome, Kawasaki (JP); Hiroyuki Ohta, Kokubunji (JP); Mitsugu Tajima, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 1688 days.

(21) Appl. No.: 12/567,084

(22) Filed: Sep. 25, 2009 (Under 37 CFR 1.47)

(65) Prior Publication Data

US 2010/0078729 A1　Apr. 1, 2010

Related U.S. Application Data

(63) Continuation of application No. PCT/JP2007/056458, filed on Mar. 27, 2007.

(51) Int. Cl.
*H01L 27/088*　(2006.01)
*H01L 21/8238*　(2006.01)
(Continued)

(52) U.S. Cl.
CPC ........ *H01L 21/823842* (2013.01); *H01L 21/28035* (2013.01); *H01L 21/823807* (2013.01);
(Continued)

(58) Field of Classification Search
CPC ........... H01L 23/373; H01L 29/7842; H01L 2924/351; H01L 29/1054; H01L 23/49544; H01L 23/49562; B81B 3/0072
(Continued)

(56) References Cited

U.S. PATENT DOCUMENTS 6,362,511 B1 *　3/2002　Mizushima et al. .......... 257/412
7,462,524 B1 *　12/2008　Peidous ............ H01L 29/66545
　　　　　　　　　　　　　　　　　　438/197
(Continued)

FOREIGN PATENT DOCUMENTS

JP　　11-097380 A　　4/1999
JP　　2004-172389 A　6/2004
(Continued)

OTHER PUBLICATIONS

International Search Report of PCT/JP2007/056458, dated Jun. 26, 2007.
(Continued)

*Primary Examiner* — Mary Wilczewski
*Assistant Examiner* — Tsz Chiu
(74) *Attorney, Agent, or Firm* — Westerman, Hattori, Daniels & Adrian, LLP

(57) ABSTRACT

A semiconductor device includes a transistor configuration including first and second gate electrodes, each of the first and second gate electrodes having at least a bottom layer and an upper layer including polycrystalline silicon grains, wherein the first gate electrode is a nMOS gate electrode formed in an nMOS region of the transistor configuration, wherein the polycrystalline silicon grains included in the bottom layer of the first gate electrode have a greater particle diameter than the polycrystalline grains included in the upper layer of the second gate electrode.

10 Claims, 8 Drawing Sheets

(51) Int. Cl.
*H01L 21/28* (2006.01)
*H01L 29/49* (2006.01)
*H01L 29/66* (2006.01)
*H01L 29/78* (2006.01)

(52) U.S. Cl.
CPC .... *H01L 29/4925* (2013.01); *H01L 29/66636* (2013.01); *H01L 29/7845* (2013.01); *H01L 29/7848* (2013.01); H01L 29/7833 (2013.01); H01L 29/7834 (2013.01)

(58) Field of Classification Search
USPC .................. 257/327, 336, 344, 408, 900
See application file for complete search history.

(56) References Cited

U.S. PATENT DOCUMENTS

| | | | | |
|---|---|---|---|---|
| 7,538,387 | B2* | 5/2009 | Tsai | 257/327 |
| 2001/0050386 | A1* | 12/2001 | Suzuki | H01L 21/32051 257/296 |
| 2001/0055862 | A1 | 12/2001 | Bevk | |
| 2002/0081794 | A1* | 6/2002 | Ito | 438/200 |
| 2004/0058499 | A1* | 3/2004 | Ishitsuka | H01L 21/28123 438/296 |
| 2004/0097030 | A1 | 5/2004 | Sayama et al. | |
| 2005/0003621 | A1* | 1/2005 | Nakaoka et al. | 438/301 |
| 2005/0093030 | A1* | 5/2005 | Doris | H01L 21/823807 257/288 |
| 2005/0121727 | A1* | 6/2005 | Ishitsuka | H01L 21/76224 257/369 |
| 2005/0189597 | A1 | 9/2005 | Masuoka et al. | |
| 2005/0253205 | A1 | 11/2005 | Kawamura | |
| 2005/0266631 | A1* | 12/2005 | Kim et al. | 438/216 |
| 2005/0269662 | A1* | 12/2005 | Ishitsuka | H01L 21/823481 257/510 |
| 2006/0202280 | A1 | 9/2006 | Shima et al. | |
| 2007/0018255 | A1 | 1/2007 | Kawamura | |
| 2007/0126036 | A1* | 6/2007 | Ohta et al. | 257/288 |
| 2011/0084314 | A1* | 4/2011 | Or-Bach | G03F 9/7076 257/209 |

FOREIGN PATENT DOCUMENTS

| | | |
|---|---|---|
| JP | 2004-356431 A | 12/2004 |
| JP | 2005-251801 A | 9/2005 |
| JP | 2006-253318 A | 9/2006 |
| WO | 2005/112089 A1 | 11/2005 |

OTHER PUBLICATIONS

Japanese Office Action dated Aug. 21, 2012, issued in corresponding Japanese Patent Application No. 2009-506176, (9 pages). With English Translation.

* cited by examiner

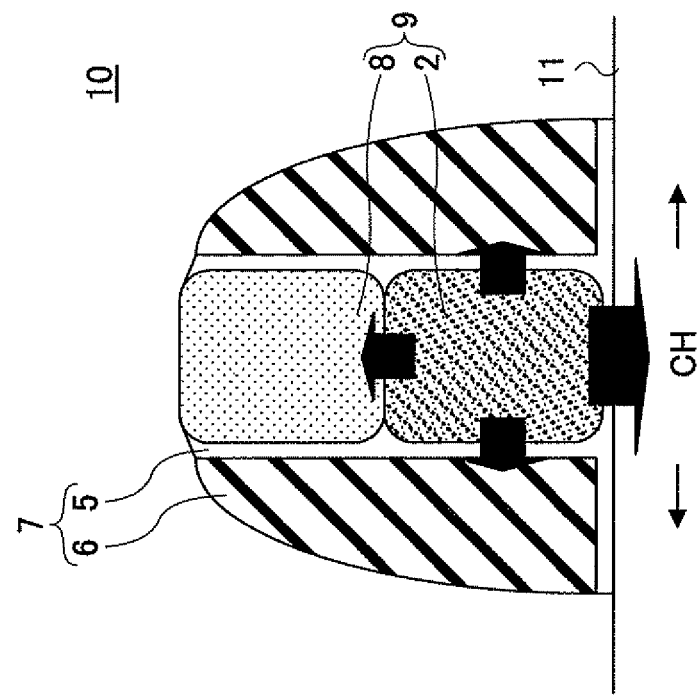
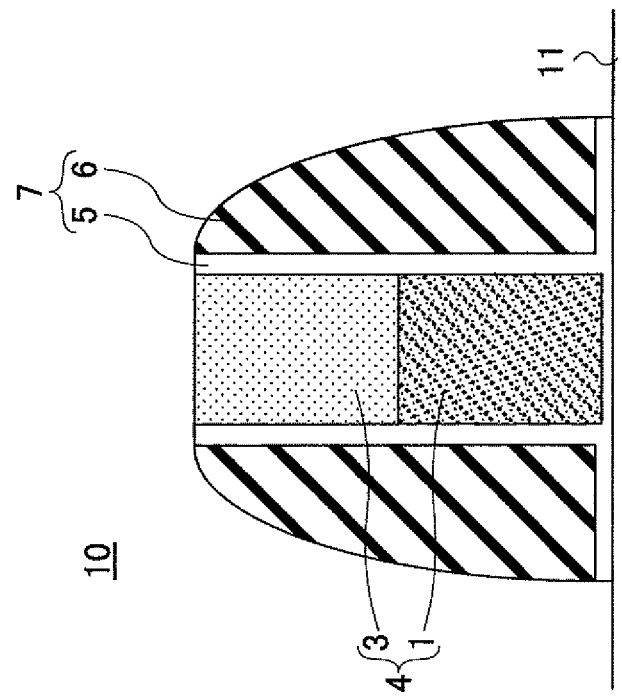

SEMICONDUCTOR DEVICE AND METHOD OF MANUFACTURING THE SEMICONDUCTOR DEVICE

CROSS-REFERENCE TO RELATED APPLICATIONS

This patent application is based upon and claims the benefit of priority under 35 USC 120 and 365(c) of PCT application JP2007/056458 filed in Japan on Mar. 27, 2007, the entire contents of which are incorporated herein by reference.

FIELD

The embodiments discussed herein are related to a semiconductor device and a method of manufacturing the semiconductor device.

BACKGROUND

Due to the significant advances in the miniaturization of semiconductor devices including CMOS devices, MOSFET operations are close to reaching their physical limits. As the miniaturization advances, characteristics and circuit properties of a CMOS device are difficult to improve simply by scaling of device dimensions including a simple gate length. Therefore, as a method of improving transistor characteristics other than miniaturization, strained silicon technology is being researched. The strained silicon technology is a technology for improving transistor characteristics by increasing the mobility of carriers by applying strain to channel regions of a CMOS transistor. As typical methods of applying strain to channel regions, there is a method of applying a coat of a stress film after forming a transistor or a method of burying a substance having a lattice constant different from silicon into a source/drain region. These methods are being employed for actual products.

Further, there is also a technology of applying stress to a channel by using a volume expansion of a gate (see, for example, Japanese Laid-Open Patent Publication No. 2004-172389). In Japanese Laid-Open Patent Publication No. 2004-172389, a gate is formed by polysilicon and is made amorphous (non-crystal) by injecting an impurity having a relatively large atomic mass number. After arranging the shape, the gate is heated at a temperature of approximately 1000° C. and re-crystallized. In this re-crystallization, by taking advantage of strong compressive stress remaining inside a gate electrode and applying a tensile stress to a channel region below the gate electrode, carrier mobility of an nMOS transistor is improved.

However, with the technology of Japanese Laid-Open Patent Publication No. 2004-172389, due to the gate electrode being formed by amorphous silicon of a single layer, the compressive stress generated in the gate electrode is easily released upward (exerted upward) from the gate electrode. Accordingly, stress cannot be efficiently applied to the channel region immediately below the gate electrode. In order to prevent this from occurring, a cap film may be provided on the gate electrode. However, the presence of the cap film may cause impurities inside the single layer gate electrode to pass through a gate insulating layer and horizontally spread in a surface region of the substrate. In such a case, the distribution of the impurities may be degraded and lead to degrading of transistor characteristics.

SUMMARY

According to an aspect of the invention, there is provided a semiconductor device including: a transistor configuration including first and second gate electrodes, each of the first and the second gate electrodes having at least a bottom layer and an upper layer including polycrystalline silicon grains; wherein the first gate electrode is a nMOS gate electrode formed in an nMOS region of the transistor configuration; wherein the polycrystalline silicon grains included in the bottom layer of the first gate electrode have a greater particle diameter than the polycrystalline grains included in the upper layer of the first gate electrode.

Additional objects and advantages of the embodiments are set forth in part in the description which follows, and in part will become obvious from the description, or may be learned by practice of the invention.

The object and advantages of the invention may be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIGS. 1A and 1B are schematic diagrams for describing a basic configuration of a semiconductor device according to an embodiment of the present invention;

DESCRIPTION OF EMBODIMENT(S)

Figure 2A:
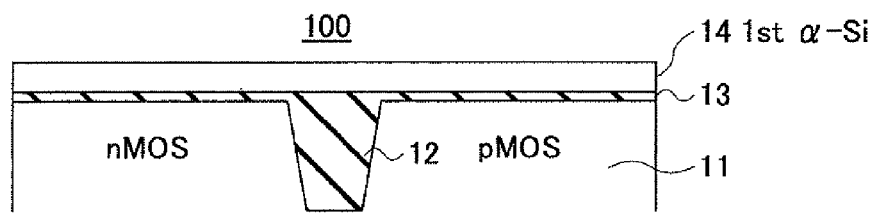
FIG. 2A is a schematic diagram illustrating a step of manufacturing a semiconductor device according to a first embodiment of the present invention.

Preferred embodiments of the present invention will be explained with reference to accompanying drawings.

FIGS. 1A and 1B are schematic diagrams for describing a basic structure of a semiconductor device according to an embodiment of the present invention. By performing a thermal process on a structure illustrated in FIG. 1A, a configuration illustrated in FIG. 1B can be obtained. The structure illustrated in FIG. 1A includes a gate electrode pattern 4 having a double layer structure. The gate electrode pattern 4 includes an amorphous silicon bottom layer 1 into which an impurity is included and an amorphous silicon upper layer 3 formed on top of the bottom layer 1. The impurity is contained into the bottom layer 1 before performing patterning on the gate electrode pattern 4. For example, phosphorous (P) is implanted (doped) as the impurity with respect to an nMOS region, and boron (B) is implanted (doped) as the impurity with respect to a pMOS region. After the implantation of the impurity, a thermal process is performed on the gate electrode pattern 4. Thereby, grains in the bottom layer 1 of the nMOS region of the gate electrode pattern 4 become a large size. As a result, the gate electrode pattern 4 becomes a gate electrode 9 including a polysilicon bottom layer 2 having large size grains.

The phosphor (P) implanted into the bottom layer 1 of the nMOS region of the gate electrode pattern 4 has a relatively large atomic radius and a large lattice constant. Accordingly, internal force is generated by volume expansion caused by the thermal process as illustrated in FIG. 1B. Because a polysilicon upper layer 8 is formed on top of the bottom layer 2 and a sidewall spacer 7 is formed on both sides of the polysilicon upper layer 8, the internal force is mainly applied to a channel region CH of a semiconductor substrate 11 located below the gate electrode 9. As a result, a tensile stress is generated in the source/drain direction in the N channel region. This enables the driving force of a transistor to be increased. It is to be noted that the gate electrode 9 may be a layered structure having three or more layers because force can be efficiently applied to an N channel region if large sized grains are included in the bottommost gate layer nearest to the N channel region. In a case where the gate electrode 9 is formed with three or more layers, at least the bottommost polysilicon layer is to include grains larger than those of the layers formed above the bottommost polysilicon layer.

Even after the thermal process, the boron (B) implanted in the bottom layer 2 of the pMOS region of the gate electrode 9 has a relatively small grain size compared to that of the nMOS region. Therefore, the stress applied to the p channel region CH is relatively small. Accordingly, the tensile stress toward the p channel region can be suppressed. As a result, the mobility of carriers can be prevented from decreasing. Further, a Tinv (apparent film thickness determined by inverted gate capacitance) which is thinner than that for the gate using a single layer of polysilicon can be attained owing to the impurity included in the bottom layer 2 of the pMOS region of the gate electrode 9.

The thermal process is performed after the bottom layer 1 and the upper layer 3 are formed into the configuration (shape) of the gate electrode pattern 4 as illustrated in FIG. 1A. For example, the thermal process may be performed when annealing the source and drain or when forming the sidewall spacer 7 (film deposition of sidewall spacer 7).

In both the pMOS region and the nMOS region, the thermal process causes the impurities to spread to the upper amorphous silicon layer 3. Therefore, penetration of impurities to the channel regions can be sufficiently prevented. In addition, depletion of the amorphous silicon gate can also be prevented.

Accordingly, even if no cap layer is formed above the gate electrode 9, a tensile stress can be efficiently generated in the n channel region. In addition, degradation of the penetration of impurities in the channel regions can be prevented and depletion of the gate electrode can be prevented.

Next, a method of manufacturing a semiconductor device 100 according to embodiments of the present invention is described.

First Embodiment

FIGS. 2A through 2H illustrate the steps of manufacturing a semiconductor device 100 according to a first embodiment of the present invention. As illustrated in FIG. 2A, an STI (Shallow Trench Isolation) structure 12 and a gate insulation film 13 are formed on a semiconductor substrate 11 by performing a regular CMOS (Complementary Metal Oxide Semiconductor) process. An amorphous silicon film 14 is deposited as a first layer of a gate electrode 20 (20N, 20P). The film thickness of the amorphous silicon film 14 is, for example, 10 nm-50 nm.

Figure 2B:
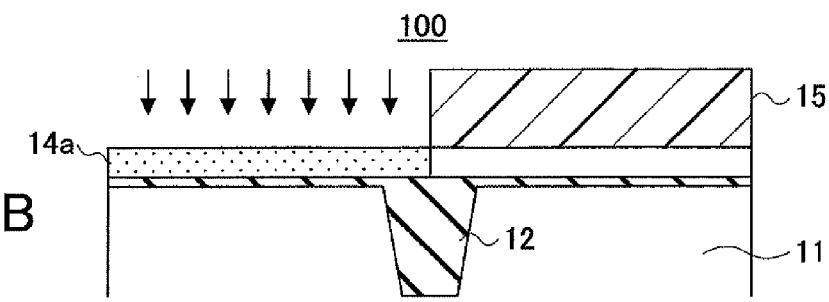
FIG. 2B is a schematic diagram illustrating a step of manufacturing a semiconductor device according to the first embodiment of the present invention.

Then, as illustrated in FIG. 2B, after coating the entire surface of the amorphous silicon film 14 with resist, a resist mask 15 is formed by performing a lithography process on the amorphous silicon film 14 coated with resist. The resist mask 15 is formed with a pattern in which an aperture (opening) is formed in the area corresponding to the nMOS region whereas the area corresponding to the pMOS region is covered by the resist mask 15. It is, however, to be noted that, although the resist mask 15 of FIG. 2B is formed having an aperture formed in the area corresponding to the nMOS region, the resist mask 15 may alternatively be formed having an aperture formed in the area corresponding to the pMOS region and the nMOS region being covered by the resist mask 15. That is, the below-described resist mask 16 may be formed before forming the resist mask 15.

In this state illustrated in FIG. 2B, an amorphous silicon film 14a is formed as a bottom layer (in this example, first layer of nMOS region) by implanting phosphorus (P) in the nMOS region of the amorphous silicon film 14. The concentration of the implantation is, for example, 1E14-3E16 $cm^{-2}$. In addition to implanting phosphorus, As, Sb, N, Ge, or Si, for example, may also be implanted according to necessity. Because an impurity is introduced into the amorphous silicon film 14a (first layer of the nMOS region) by the implantation, the amorphous silicon of the amorphous silicon film 14a is changed into polycrystalline silicon having large grain size by performing a thermal process on the semiconductor device 100 in a subsequent step. In addition, depletion of the gate electrode can be prevented.

Figure 2C:
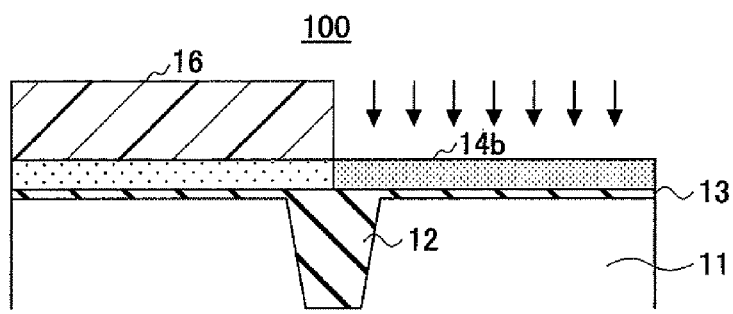
FIG. 2C is a schematic diagram illustrating a step of manufacturing a semiconductor device according to the first embodiment of the present invention.

Then, as illustrated in FIG. 2C, the resist mask 15 is removed. Then, a new resist coating is applied onto the entire surface of the semiconductor device 100. Then, a resist mask 16 is formed by performing a lithography process. The resist mask 16 is formed with a pattern in which an aperture (opening) is formed in the area corresponding to the pMOS region whereas the area corresponding to the nMOS region is covered by the resist mask 16. In this state illustrated in FIG. 2C, an amorphous silicon film 14b is formed as a bottom layer (first layer of the pMOS region) by implanting an impurity such as B, BF2, Ge, N, or F to the pMOS region of the amorphous silicon film 14. Because an impurity is introduced into the amorphous silicon film 14b (first layer of the pMOS region) by the implantation, depletion of the gate electrode can be prevented. In addition, the semiconductor device 100 can attain a Tinv thinner than that for the gate using a single layer of the polysilicon.

Figure 2D:
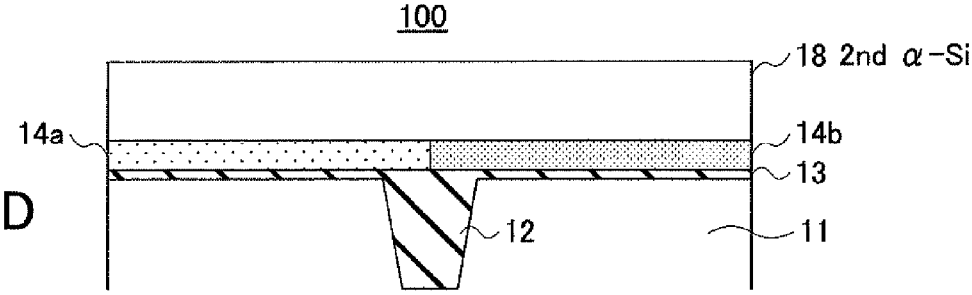
FIG. 2D is a schematic diagram illustrating a step of manufacturing a semiconductor device according to the first embodiment of the present invention.

Then, in FIG. 2D, an amorphous silicon film 18 is deposited as a second layer of the gate electrode 20 (20N, 20P). The film thickness of the amorphous silicon film 18 is, for example, 50 nm-100 nm. The second layer may be deposited on a natural oxide layer according to necessity.

Figure 2E:
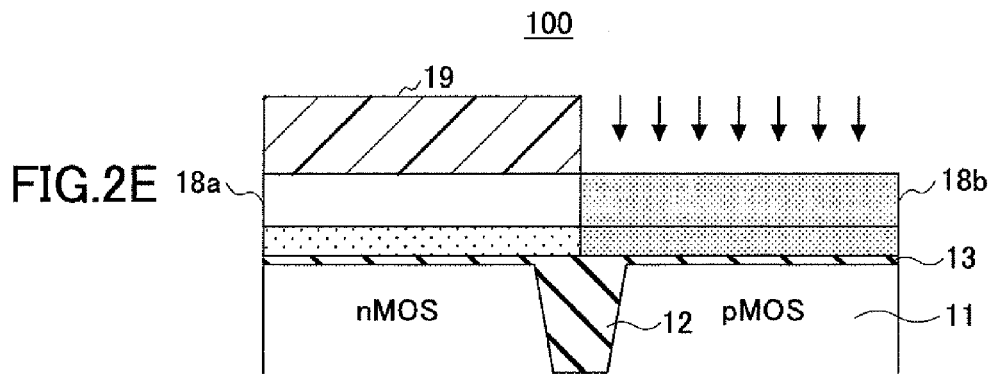
FIG. 2E is a schematic diagram illustrating a step of manufacturing a semiconductor device according to the first embodiment of the present invention.

Then, as illustrated in FIG. 2E, after coating the entire surface of the amorphous silicon film 18 with resist, a resist mask 19 is formed by performing a lithography process on the amorphous silicon film 18 coated with resist. The resist mask 19 is formed with a pattern in which an aperture (opening) is formed in the area corresponding to the pMOS region whereas the area corresponding to the nMOS region is covered by the resist mask 19. In this state illustrated in FIG. 2E, an amorphous silicon film 18b is formed as a second layer of the pMOS region by implanting an impurity such as B, BF2, Ge, N, or F to the pMOS region of the amorphous silicon film 18. Because an impurity is introduced into the amorphous silicon film 18b by the implantation, processing (e.g., dry-etching) of the below-described pMOS gate electrode 20P becomes easier such that a rectangular shaped gate electrode 20P can be formed. However, the steps illustrated with FIG. 2E may be omitted depending on the conditions of the dry-etching process. Further, an amorphous silicon film 18a may also be formed as a second layer of the nMOS region by also performing ion implantation to the nMOS region of the amorphous silicon film 18.

Figure 2F:
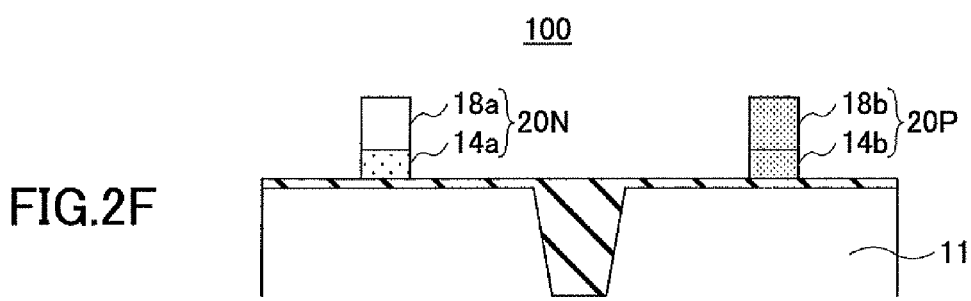
FIG. 2F is a schematic diagram illustrating a step of manufacturing a semiconductor device according to the first embodiment of the present invention.
Figure 2G:
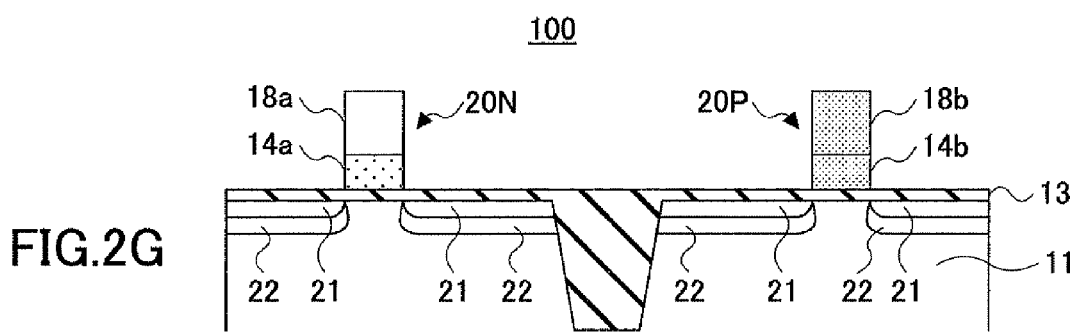
FIG. 2G is a schematic diagram illustrating a step of manufacturing a semiconductor device according to the first embodiment of the present invention.

Then, according to necessity, a hard mask (not illustrated) may be formed by depositing silicon oxide or silicon nitride at a low temperature to the extent that the amorphous silicon formed on the semiconductor device 100 is not crystallized (e.g. approximately equal to or below 530° C.) and performing a lithography process on the semiconductor device 100. By performing a dry-etching process using the hard mask, gate electrodes 20 including gate electrode patterns 20N and 20P are formed as illustrated in FIG. 2F.

Then, a lithography process is performed so that an aperture (opening) is formed in the area corresponding to the nMOS region whereas the region corresponding to the pMOS region is covered with resist (not illustrated). In this embodiment, although an aperture is formed in the area corresponding to the nMOS region before forming an aperture in the area corresponding to the pMOS region, an aperture may first be formed in the area corresponding to the pMOS region and then an aperture may be formed in the area corresponding to the nMOS region. Then, in FIG. 2G, a pocket area 22 is formed by implanting a pocket impurity (e.g., B) of the nMOS region at the area of the opening. The pocket impurity is implanted at a tilt angle of 0°-45°. Alternatively, In or BF2 may be used as the pocket impurity. Further, according to necessity, nitrogen, fluorine, carbon, or germanium (Ge) may also be implanted in addition to the pocket impurity such as B. Then, an extension region 21 is formed by implanting an extension impurity (e.g., As) at the area of the opening. Alternatively, P or Sb may be used as the extension impurity.

Then, after removing resist covering the area corresponding to the pMOS region, a lithography process is performed so that an aperture (opening) is formed in the area corresponding to the pMOS region whereas the region corresponding to the nMOS region is covered with resist (not illustrated). Then, a pocket area 22 is formed by implanting a pocket impurity (e.g., P) of the pMOS region at the area of the opening. The pocket impurity is implanted at a tilt angle of 0°-45°. Alternatively, As or Sb may be used as the pocket impurity. Further, according to necessity, nitrogen, fluorine, carbon, or germanium (Ge) may also be implanted in addition to the pocket impurity such as P. Then, an extension region 21 is formed by implanting an extension impurity (e.g., B) at the area of the opening. Alternatively, BF2 may be used as the extension impurity. Then, the resist covering the region corresponding to the nMOS region is removed.

Figure 2H:
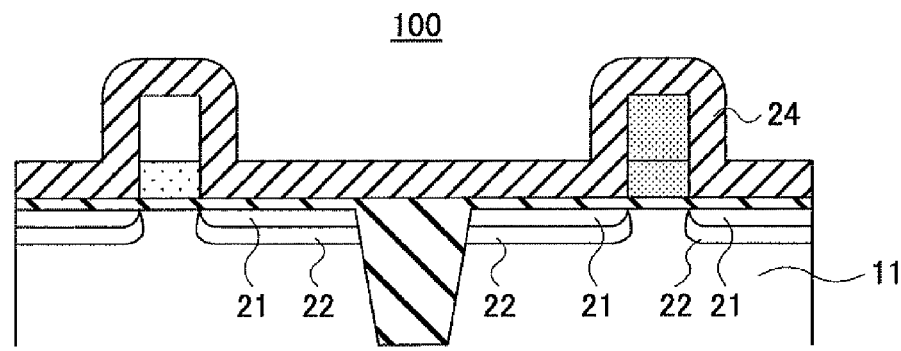
FIG. 2H is a schematic diagram illustrating a step of manufacturing a semiconductor device according to the first embodiment of the present invention.

Then, as illustrated in FIG. 2H, an insulation film (low temperature insulation film) 24 to be used as a sidewall spacer is deposited at a low temperature to the extent of not crystallizing amorphous silicon. For example, a silicon oxide film is deposited at a temperature equal to or less than 530° C. by using a CVD method. The silicon oxide film is formed with a thickness of approximately 5-20 nm.

Figure 2I:
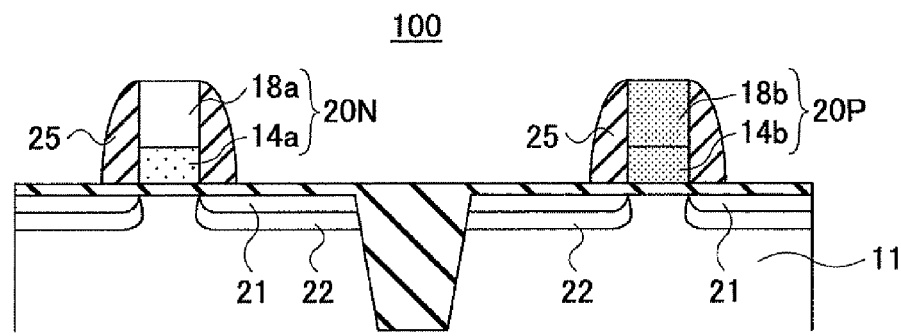
FIG. 2I is a schematic diagram illustrating a step of manufacturing a semiconductor device according to the first embodiment of the present invention.

Then, as illustrated in FIG. 2I, a sidewall spacer 25 is formed at the gate electrodes 20 (20N, 20P) by performing anisotropic etching on the low temperature insulation film 24. Although a silicon oxide film is used as the insulation film forming the sidewall spacer 25, other films may be used as the insulation film as long as the insulation film can be deposited at a sufficiently low temperature without crystallizing amorphous silicon. For example, a silicon nitride film may be used as the insulation film. Further, the low temperature insulation film 24 is not limited to a single layer structure but may be formed with plural insulation layers. Further, the thickness of the low temperature insulation film 24 may be adjusted where appropriate.

Figure 2J:
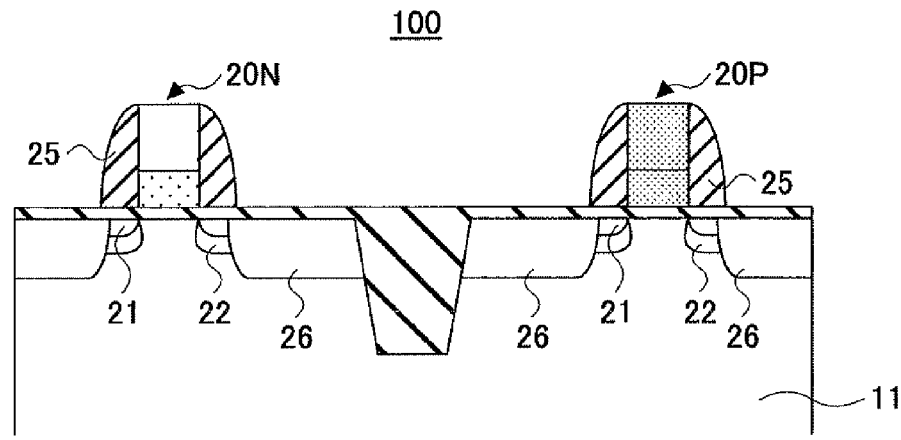
FIG. 2J is a schematic diagram illustrating a step of manufacturing a semiconductor device according to the first embodiment of the present invention.

As illustrated in FIG. 2J, an aperture (opening) is formed in the area corresponding to the nMOS region and then another aperture (opening) is formed in the area corresponding to the pMOS region. It is, however, to be noted that the order for forming the openings in the nMOS and pMOS regions may be switched. Then, a source 26 and a drain 26 are formed by implanting impurities via the sidewalls of the sidewall spacers 25 in the nMOS and pMOS regions.

Figure 2K:
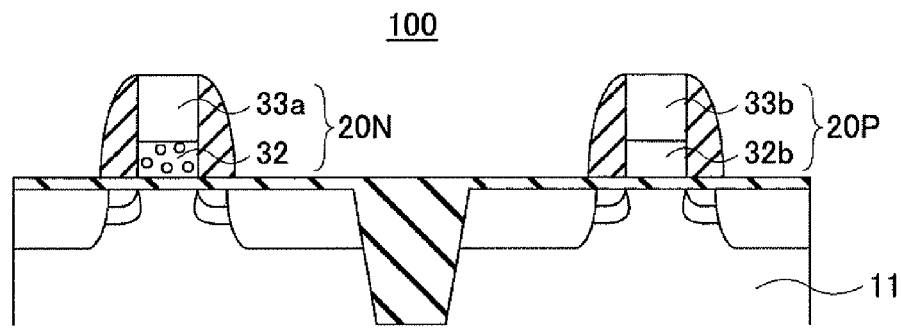
FIG. 2K is a schematic diagram illustrating a step of manufacturing a semiconductor device according to the first embodiment of the present invention.

Then, as illustrated in FIG. 2K, an activation annealing process is performed on the semiconductor device 100. By performing the activation annealing process, the impurities in the source 26 and the drain 26 can be activated and the amorphous silicon film of the gate electrodes 20 can be poly-crystallized. During the annealing process, the grain size of crystals increases only in the first layer of the gate electrode 20N of the nMOS region. Accordingly, a polysilicon film 32 having large grain size is formed in the first layer of the gate electrode 20N of the nMOS region. The crystal grain size in other amorphous silicon films does not increase as much as the first layer of the gate electrode 20N. Thus, the other amorphous silicon films are poly-crystallized, so that a polysilicon film 33a is formed in the second layer of the gate electrode 20N of the nMOS region, and polysilicon films 32b, 33b are formed in the first and second layers of the gate electrode 20P of the pMOS region. Accordingly, volume expansion occurs only in the first layer 32 located at the vicinity of the bottom surface of the gate electrode 20N of the nMOS region, so that compressive stress in a vertical direction can be selectively applied to an area immediately below the nMOS gate electrode 20N.

Second Embodiment

Figure 3A:
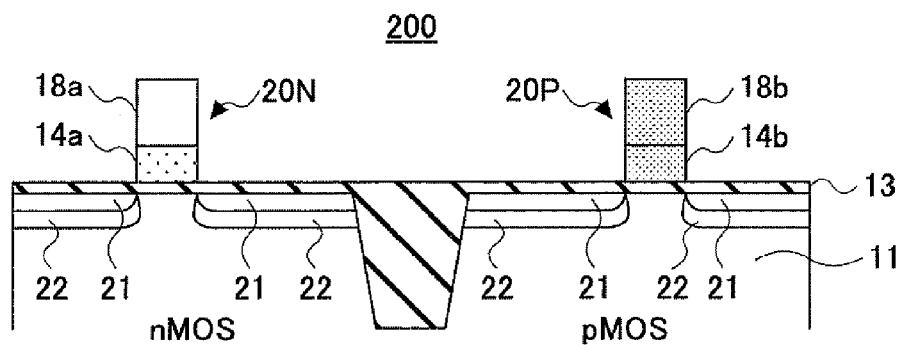
FIG. 3A is a schematic diagram illustrating a step of manufacturing a semiconductor device according to a second embodiment of the present invention.
Figure 3B:
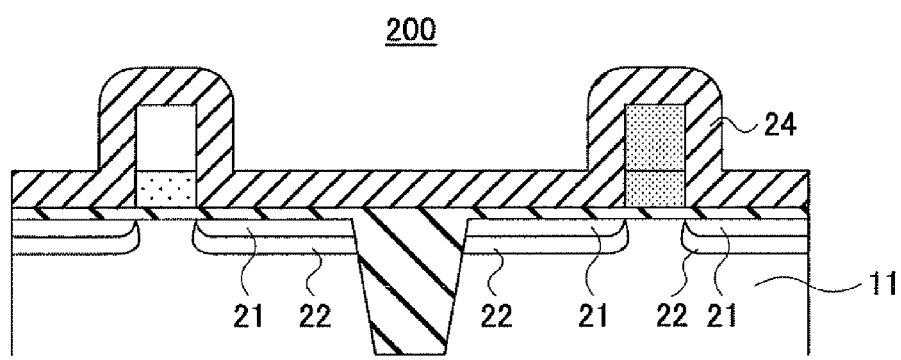
FIG. 3B is a schematic diagram illustrating a step of manufacturing a semiconductor device according to the second embodiment of the present invention.

Next, the steps of manufacturing a semiconductor device 200 according to a second embodiment of the present invention are described with reference to FIGS. 3A-3C. In the above-described first embodiment, amorphous silicon is poly-crystallized by performing the activation annealing process after forming the source/drain 26. In the second embodiment, another thermal process, separate (independent) from the activation annealing process is performed.

The steps performed until the step illustrated in FIG. 2H of the first embodiment are the same as the second embodiment. As illustrated in FIG. 3A, different impurities are implanted into the amorphous silicon films 14a and 14b in the pMOS region and the nMOS region. Then, another amorphous silicon film 18 is deposited on the amorphous silicon films 14a, 14b. Then, gate electrodes 20 having gate electrode patterns 20N, 20P with double layer structures are formed. Then, as illustrated in FIG. 3B, an insulator film 24 is formed on the entire surface of the semiconductor device 200 by depositing the insulator film 24 at a low temperature.

Figure 3C:
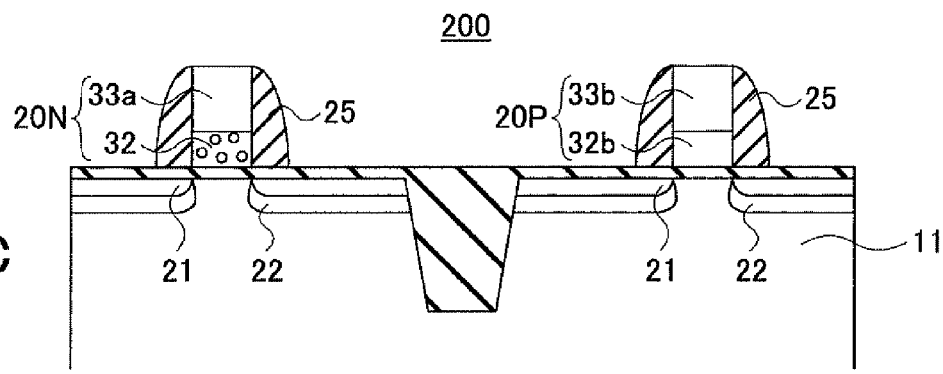
FIG. 3C is a schematic diagram illustrating a step of manufacturing a semiconductor device according to the second embodiment of the present invention.

In FIG. 3C, after sidewall spacers 25 are formed, a thermal process is performed on the semiconductor device 200. By performing the thermal process, the amorphous silicon films 14, 18 are poly-crystallized. A given thermal process may be used as long as the poly-crystallization can be achieved. For example, the thermal process may be a furnace annealing process or a RTA (Rapid Thermal Annealing) process. During the poly-crystallization, the particle diameter of the grains increases in the bottom layer 14a of the gate electrode pattern 20N of the nMOS region. Accordingly, a polysilicon film 32 having large grain size is formed in the first layer of the gate electrode 20N of the nMOS region. The crystal grain size formed in the amorphous silicon films of the pMOS region does not significantly increase. Accordingly, a polysilicon film 32b having its volume expansion suppressed is obtained. Further, the thermal process causes the impurities in the bottom surfaces 32, 32b to diffuse to the layers formed thereabove. As a result, polysilicon films 33a and 33b are formed as the upper layers of the gate electrodes 20N, 20P.

It is to be noted that, in the second embodiment, this thermal process may be performed at a given stage after the sidewall spacers 25 are formed.

Third Embodiment

Figure 4A:
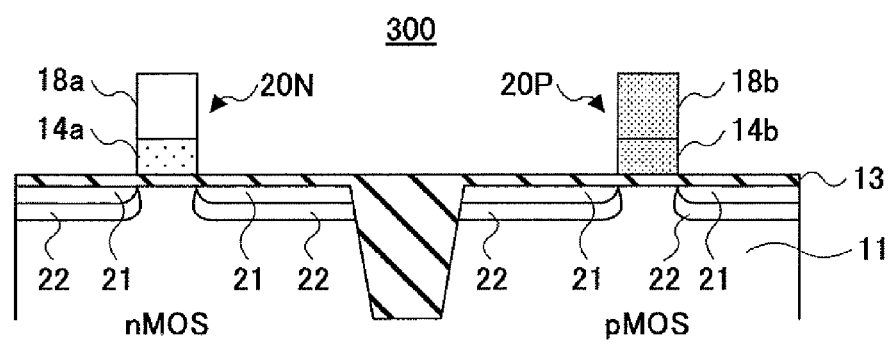
FIG. 4A is a schematic diagram illustrating a step of manufacturing a semiconductor device according to a third embodiment of the present invention.
Figure 4B:
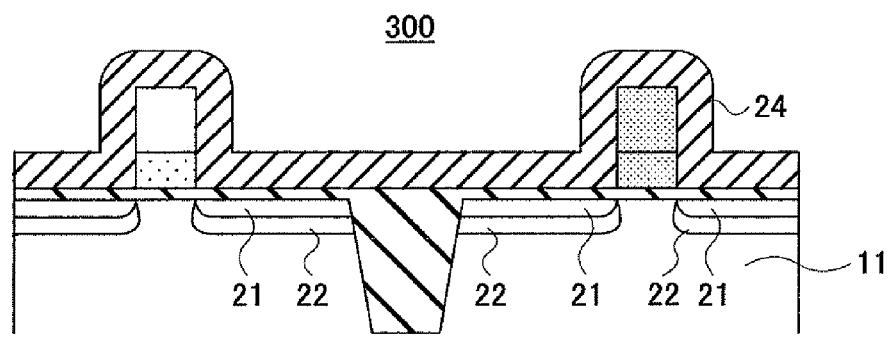
FIG. 4B is a schematic diagram illustrating a step of manufacturing a semiconductor device according to the third embodiment of the present invention.
Figure 4C:
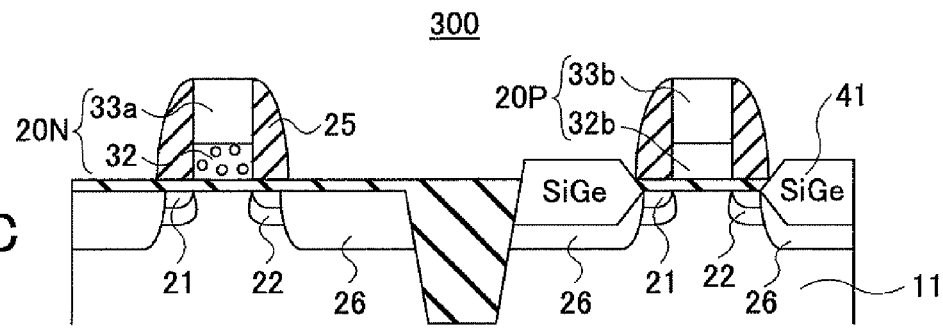
FIG. 4C is a schematic diagram illustrating a step of manufacturing a semiconductor device according to the third embodiment of the present invention.

Next, the steps of manufacturing a semiconductor device 300 according to a third embodiment of the present invention are described with reference to FIGS. 4A-4C. In the above-described first embodiment, amorphous silicon is poly-crystallized by performing the activation annealing process. In the third embodiment, amorphous silicon is poly-crystallized by using the heat generated during selective epitaxial growth instead of performing the activation annealing process.

The steps performed until the step illustrated in FIG. 2H of the first embodiment are the same as the third embodiment. As illustrated in FIG. 4A, different impurities are implanted into the amorphous silicon films 14a and 14b in the pMOS region and the nMOS region. Then, another amorphous silicon film 18 is deposited on the amorphous silicon films 14a, 14b. Then, gate electrodes 20 having gate electrode patterns 20N, 20P with double layer structures are formed. Then, as illustrated in FIG. 4B, an insulator film 24 is formed on the entire surface of the semiconductor device 300 by depositing the insulator film 24 at a low temperature.

Then, after sidewall spacers 25 are formed, an insulator film 24a (not shown) is formed on the entire surface of the semiconductor device 300 by depositing the insulator film 24a at a low temperature. By performing, for example, a lithography process and an etching process on the semiconductor device 300, an aperture (opening) is formed only in the area corresponding to the pMOS region whereas the area corresponding to the nMOS region remains covered by the insulation film 24. Then, areas of the silicon substrate 11 corresponding to the source and the drain of the pMOS region are recessed by performing a dry-etching process. Other than the dry-etching process, recesses may be formed by performing a wet-etching process using, for example, TMAH (tetramethylammonium hydroxide). Then, a selective epitaxial growth is performed on the recessed portions of the substrate 11. In the selective epitaxial growth process, SiGe grows in the recessed portions at a growth temperature of approximately 600° C. As a result, a SiGe strain generating layer 41 is formed. The SiGe strain generating layer 41 applies a compressive stress from both the source side and the drain side to the channel area of the pMOS region in a horizontal direction. Thereby, carrier mobility can be improved.

The heat during the SiGe growth causes poly-crystallization of the amorphous silicon in the gate electrode patterns 20N and 20P. During the SiGe growth, the particle size of crystal grains increases only in the bottom layer of the gate electrode 20N of the nMOS region. Accordingly, a polysilicon film 32 having large grain size is formed in the first bottom layer of the gate electrode 20N of the nMOS region. Because volume expansion occurs in the polysilicon film 32 in correspondence with the increase of size (particle diameter) of the grains in the polysilicon film 32, compressive stress in a vertical direction can be selectively applied to an area immediately below the nMOS gate electrode 20N. The compressive stress in the vertical direction contributes to generation of a tensile stress in a horizontal direction in the nMOS channel region.

Then, ion implantation is performed on areas corresponding to the source and drain in the nMOS transistor. Then, processes such as active annealing and silicide formation are performed on the semiconductor device 300.

Although the third embodiment is described by using an example of a SiGe source and drain (SD), the heat from other epitaxial growth processes may be used.

Fourth Embodiment

Next, the steps of manufacturing a semiconductor device 400 according to a fourth embodiment of the present invention are described with reference to FIGS. 5A-5C. In the above-described first embodiment, amorphous silicon is poly-crystallized by performing the activation annealing process. In the fourth embodiment, amorphous silicon is poly-crystallized by using the heat generated during the forming of sidewall spacers instead of performing the activation annealing process.

The steps performed until the step illustrated in FIG. 2I of the first embodiment are the same as the fourth embodiment. As illustrated in FIG. 5A, different impurities are implanted into the amorphous silicon films 14a and 14b in the pMOS region and the nMOS region. Then, another amorphous silicon film 18 is deposited on the amorphous silicon films 14a, 14b. Then, gate electrodes 20 having gate electrode patterns 20N, 20P with double layer structures are formed. Then, as illustrated in FIG. 5B, the below-described insulator films 51, 52 are formed on the entire surface of the semiconductor device 400 by depositing the insulation films 51, 52 at a low temperature.

In this embodiment, a first insulation film 51 which is to be an offset spacer is deposited at a low temperature to an extent that amorphous silicon does not crystallize. For example, the first insulation film 51 may be formed by depositing a silicon oxide film at a temperature equal to or less than 530° C. by using a CVD method. The silicon oxide film has a thickness of approximately 5 nm-20 nm. Then, a second insulation film 52 is deposited at a temperature more than that amorphous silicon is crystallized. For example, the second insulation film 52 may be formed by depositing a silicon nitride film at a temperature of approximately 550° C. by using a CVD method. The silicon nitride film has a thickness of approximately 20 nm-50 nm. The deposition of the second insulation film 52 increases the particle size (particle diameter) of the grains in the bottom layer of the gate electrode 20N in the nMOS region and causes volume expansion. In addition, the polysilicon in the gate electrode 20 is polycrystallized. Therefore, a polysilicon film 32 containing polysilicon grains having large particle diameter can be obtained in the bottom layer of the nMOS gate electrode 20N. The other amorphous silicon films are poly-crystallized, so that a polysilicon film 33a is formed in the second layer of the gate electrode 20N of the nMOS region, and polysilicon films 32b, 33b are formed in the first and second layers of the gate electrode 20P of the pMOS region.

Figure 5A:
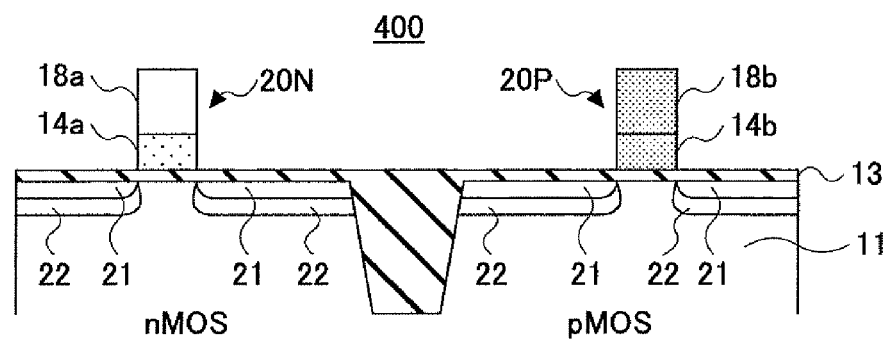
FIG. 5A is a schematic diagram illustrating a step of manufacturing a semiconductor device according to a fourth embodiment of the present invention.
Figure 5B:
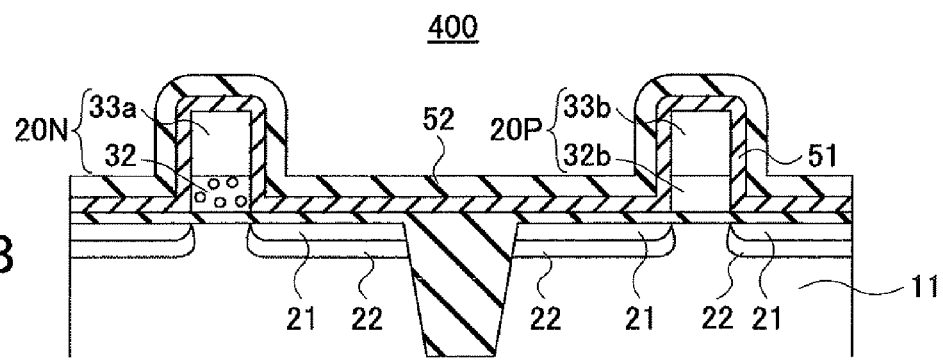
FIG. 5B is a schematic diagram illustrating a step of manufacturing a semiconductor device according to the fourth embodiment of the present invention.
Figure 5C:
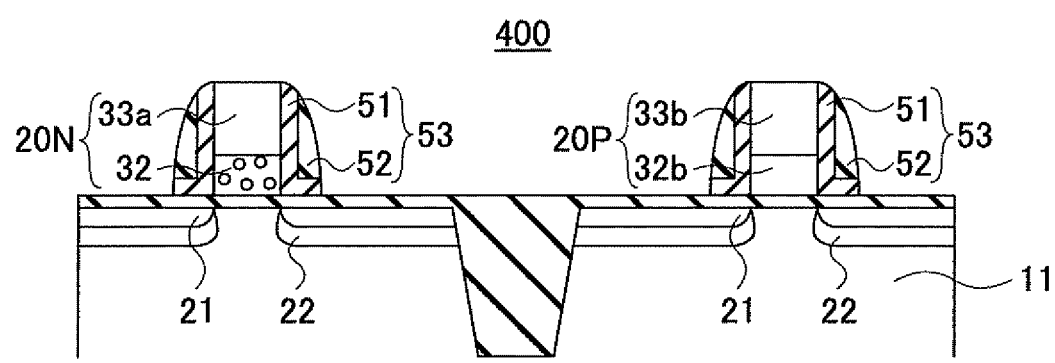
FIG. 5C is a schematic diagram illustrating a step of manufacturing a semiconductor device according to the fourth embodiment of the present invention.

Then, as illustrated in FIG. 5C, sidewall spacers 53 are formed at the sides of the gate electrodes 20N, 20P by anisotropic etching. The sidewall spacers 53 have a double-layer configuration including a first insulation film (e.g., silicon oxide film) 51 and a second insulation film (e.g., silicon nitride film) 52. By forming the sidewall spacers 53, the lattice strain caused by the force applied to the silicon substrate 11 from the volume expansion of the polysilicon film 32 (bottom layer of nMOS gate electrode 20N) can be maintained.

Then, according to necessity, an impurity is implanted in an area of a source region and a drain region of the semiconductor substrate 11 via the sidewall spacers 53, to thereby perform, for example, activation annealing or forming of silicide.

Although the double-layer configuration of the sidewall spacer 53 in the embodiment illustrated with FIGS. 5A-5C is formed by the silicon oxide film 51 and the silicon nitride film 52, other insulator films may be used as long as the insulator film can be deposited at a sufficiently low temperature enough to avoid crystallization of amorphous silicon as the film 51. Further, the sidewall spacer 53 is not limited to a double-layer configuration having two different kinds of insulator films. For example, the double-layer configuration of the sidewall spacer 53 may be fabricated by depositing the same kind of insulation film but with different deposition temperatures. Further, the thickness of the insulation films of the sidewall spacer 53 may be adjusted where appropriate.

In the stage of forming the gate electrode film pattern of a gate electrode of a gate electrode according to the above-described embodiments of the present invention, a layered configuration including two or more amorphous silicon layers is formed in which an impurity is included into a bottom layer of the layered configuration. Then, by performing a thermal process after depositing a sidewall insulation film of a gate electrode, the bottom layer of an nMOS gate electrode is formed as a polysilicon layer containing grains having large particle diameter. In contrast, the upper layer of the nMOS gate electrode and the pMOS gate electrode are formed as polysilicon layers containing grains having a relatively small particle diameter.

The volume expansion in the bottom part of the nMOS gate electrode allows force in the vertical direction to be efficiently applied to an n channel region below the nMOS gate electrode. By introducing an impurity to a bottom part of the pMOS gate electrode before processing the gate electrode, depletion of the gate electrode can be prevented. In addition, a Tinv thinner than that for the gate using a single polysilicon layer can be attained.

In both the nMOS and pMOS regions, implanted impurity diffuse in the upper layer of the gate electrodes by performing a thermal process thereto. Accordingly, gate depletion can be prevented without affecting the impurity profile of corresponding channel regions. As a result, the driving force of a fine transistor can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a transistor configuration including first and second gate electrodes on a semiconductor substrate, the first gate electrode having at least a first bottom layer and a first upper layer including polycrystalline silicon grains, the second gate electrode having at least a second bottom layer and a second bottom layer including polycrystalline silicon grains;
    wherein the first gate electrode is an nMOS gate electrode formed in an nMOS region of the transistor configuration, and the second gate electrode is a pMOS gate electrode formed in a pMOS region of the transistor configuration;
    wherein the polycrystalline silicon grains included in the first bottom layer have a greater particle diameter than the polycrystalline grains included in the first upper layer and cause volume expansion of the first bottom layer;
    wherein the volume expansion of the first bottom layer generates a compressive stress that causes the first bottom layer to apply compressive stress to a first channel region, wherein the first channel region is located immediately below the first gate electrode, the compressive stress existing in the first channel region is in a direction vertical to a surface of the semiconductor substrate, wherein the polycrystalline grains included in the first bottom layer have a greater particle diameter than the polycrystalline grains included in the second bottom layer.

2. The semiconductor device as claimed in claim 1, wherein the polycrystalline silicon grains included in the first bottom layer have a greater particle diameter than the polycrystalline grains included in the second upper layer.

3. The semiconductor device as claimed in claim 1, wherein the first bottom layer of the first gate electrode contains an impurity including at least one of P, Ge, and Si.

4. The semiconductor device as claimed in claim 1, wherein the second gate electrode contains an impurity.

5. The semiconductor device as claimed in claim 1, wherein the pMOS region includes a buried SiGe layer.

6. The semiconductor device as claimed in claim 1, wherein the first upper and bottom layers of the first gate electrode have the same thicknesses as the thicknesses of the second upper and bottom layers of the second gate electrode.

7. The semiconductor device as claimed in claim 1, wherein the each of the first and the second gate electrodes has a sidewall spacer, wherein the sidewall spacer has a double-layer configuration that maintains a lattice strain caused by the compressive stress applied to the first channel region, and wherein the double-layer configuration includes a first insulation film and a second insulation film formed on an outer side of the first insulation film.

8. The semiconductor device as claimed in claim 1, wherein the each of the first and the second gate electrodes has a sidewall spacer, wherein the sidewall spacer has a double-layer configuration that maintains a lattice strain caused by the compressive stress applied to the first channel region, wherein the double-layer configuration includes a first insulation film and a second insulation film formed on an outer side of the first insulation film, and wherein the first insulation film is a silicon oxide film and the second insulation film is a silicon nitride film.

9. The semiconductor device as claimed in claim 1, wherein the compressive stress in the first channel region is larger than a compressive stress in a second channel region located immediately below the second gate electrode.

10. The semiconductor device as claimed in claim 1, wherein dopants doped in the first bottom layer differ from dopants doped in the second bottom layer.

* * * * *